(12) United States Patent
Tsang

(10) Patent No.: US 6,839,004 B2
(45) Date of Patent: Jan. 4, 2005

(54) HIGH RATE RUN LENGTH LIMITED CODE

(75) Inventor: Kinhing Paul Tsang, Plymouth, MN (US)

(73) Assignee: Seagate Technology LLC, Scotts Valley, CA (US)

(*) Notice: Subject to any disclaimer, the term of this patent is extended or adjusted under 35 U.S.C. 154(b) by 0 days.

(21) Appl. No.: 10/295,490

(22) Filed: Nov. 15, 2002

(65) Prior Publication Data

US 2003/0102990 A1 Jun. 5, 2003

Related U.S. Application Data

(60) Provisional application No. 60/333,804, filed on Nov. 27, 2001.

(51) Int. Cl.[7] ............................................... H03M 7/00
(52) U.S. Cl. ........................................................ 341/59
(58) Field of Search .............................. 341/59, 50, 51, 341/67, 106

(56) References Cited

U.S. PATENT DOCUMENTS 5,781,133 A   7/1998 Tsang
6,198,582 B1   3/2001 Tsang et al.
6,574,773 B1 * 6/2003 Turk et al. .................. 714/792

OTHER PUBLICATIONS

Application, Entitled: Method and Apparatus for Efficient Encoding of Large Data Words at High Code Rates.

Author: Bernardo Rub et al Publication no/date: 2002–0014980–A1 / 2–7–02.

STL9695 Published in the US.

* cited by examiner

*Primary Examiner*—Brian Young
(74) *Attorney, Agent, or Firm*—Kirk A. Cesari

(57) ABSTRACT

Methods of encoding and decoding, as well as an encoding system and a digital communications system are provided for encoding data words into code words and decoding code words into data words. The data words are encoded according to a run-length-limited (RLL) code of "k" constraint, the encoding producing u-bit non-zero code words. The "k" constraint can be increased to a higher value by extending the u-bit non-zero code words to generate q-bit non-zero code words.

19 Claims, 7 Drawing Sheets

HIGH RATE RUN LENGTH LIMITED CODE

CROSS REFERENCE TO RELATED APPLICATIONS

This application claims the benefit of U.S. Provisional Application No. 60/333,804, filed Nov. 27, 2001.

FIELD OF THE INVENTION

The present invention relates generally to digital communications systems. More particularly, the present invention relates to encoding and decoding data in digital communications systems.

BACKGROUND OF THE INVENTION

In the field of digital communications, digital information is conveyed from a transmitter to a receiver through a channel. "Channel" is a generalized term that can include many things. For instance, in satellite communication systems, the channel consists of the atmosphere between an earth-bound transmitter and a satellite. In data storage devices, such as magnetic disc drives, the channel includes a storage medium where the signal is stored for some period of time before being delivered to the receiver.

All channels introduce noise into the signals they convey. To detect and sometimes to correct errors caused by this channel noise, the art has developed a large number of coding techniques. These coding techniques convert data words formed of "m" data bits into larger code words formed of "n" code bits. The additional bits in the code words permit the detection and sometimes the correction of errors in the signals received from the channel.

The ratio of the number of data bits to the number of code bits, m/n, is known as the code rate of the code. In general, the ability to detect and correct errors in a received signal increases as the code rate decreases because a lower code rate means a greater number of additional bits in the code word. However, each additional bit added by the encoder increases the time and energy needed to transmit the signal through the channel. Thus, to minimize the time and energy needed to send the code, the code rate should be maximized.

In one type of coding, known as Non-Return-to-Zero Inverse (NRZI), every digital one in a code word is represented by a transition in the transmitted signal, and every digital zero is represented by a lack of transitions in the transmitted signal. To allow the receiver to generate a clock signal from the received signal, the encoded signal is generally limited so that the number of consecutive zeros is no greater than a maximum number "k". This kind of code is known as a run-length-limited (RLL) code with a "k" constraint.

In order for a RLL code to satisfy the "k" constraint, m bits of data pattern must be mapped into n bits of code pattern that satisfy the RLL constraints. Since the constrained code pattern is a subset of the unconstrained data pattern, the value of "n" must be greater than "m". In other words, the code rate m/n must be less than one and usually this ratio increases as the value of "k" is increased in the design of a RLL code. The highest achievable code rate for a particular "k" is known as the capacity of that code. For an efficient storage channel, the higher the code rates the better. The efficiency of the code is measured by comparing the code rate against the code capacity.

To achieve higher code rates, the number of bits being encoded can be increased. For example, a 64/65 code has a higher code rate than a 17/18 code. However, with each additional bit in the input data word, the number of possible input data words increases by a multiple of 2. Thus, there are twice as many possible 64-bit data words ($2^{64}$) as there are 63-bit data words ($2^{63}$).

For even modest data word sizes, the number of available data words makes encoding through a simple table look-up inefficient. For example, for a word length of 20 bits, a table look-up encoding scheme would need to search a database of $2^{20}$ (1,048,576) entries. Thus, a system is needed for producing RLL codes that have a high code rate and also have a high efficiency.

The present invention provides a solution to this and other problems, and offers other advantages over the prior art.

SUMMARY OF THE INVENTION

Methods of encoding and decoding as well as an encoder and decoder are provided for encoding data words into code words and decoding code words into data words. The data words are encoded according to a run-length-limited (RLL) code of "k" constraint, the encoding producing q-bit non-zero code words. The "k" constraint can be increased to a higher value by extending the q-bit non-zero code words to generate (q+1)-bit non-zero code words.

DETAILED DESCRIPTION

Figure 1:
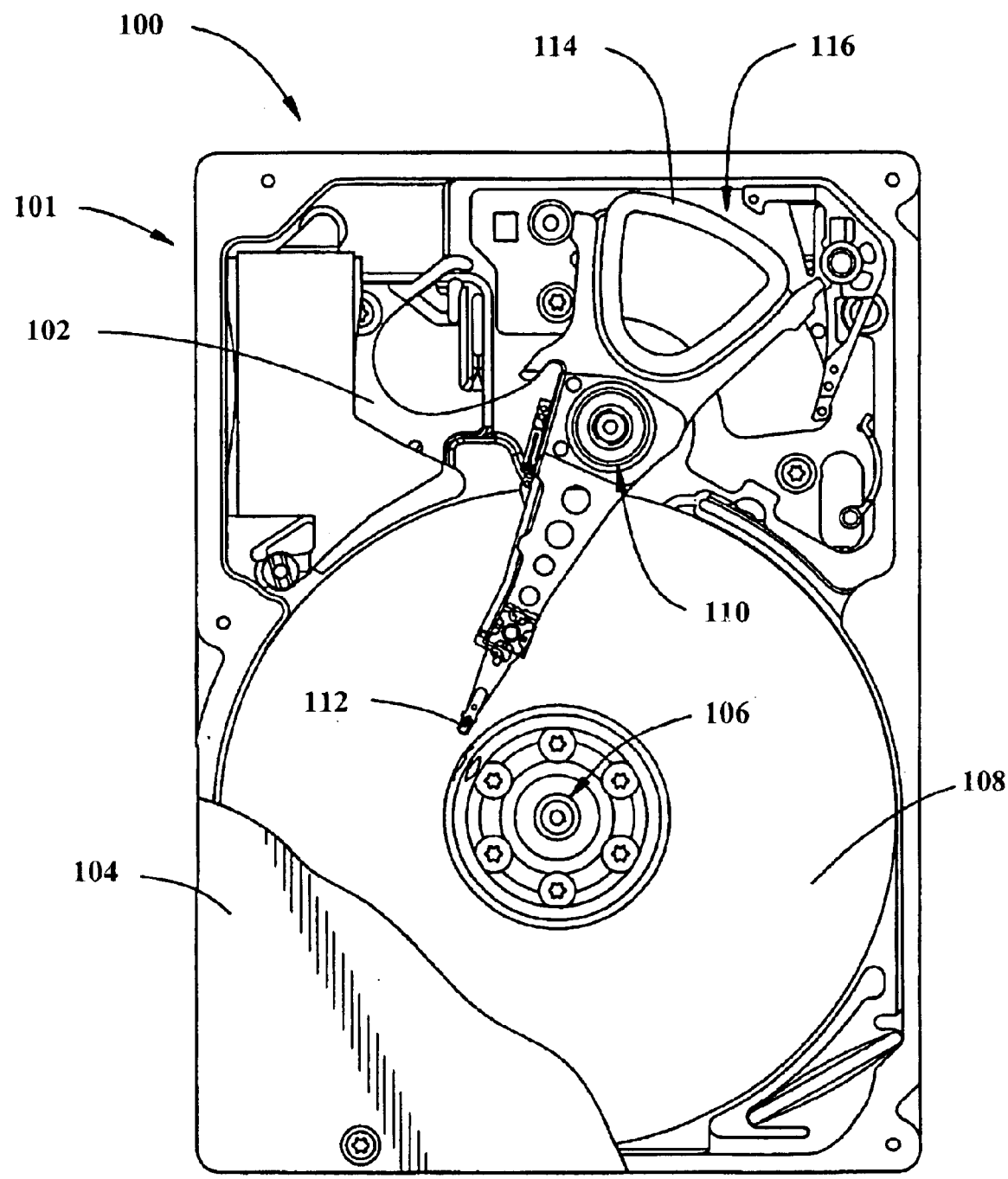
FIG. 1 illustrates a plan view of a disc drive incorporating a preferred embodiment of the present invention showing the primary internal components.

FIG. 1 is an exploded view of a disc drive 100 in which embodiments of the present invention may be used. The disc drive 100 is one example of a data storage device, such as compact disc (CDROM) devices, tape cartridge devices, digital versatile disc (DVD) or digital video disc (DVD) devices. The disc drive 100 includes a sealed housing 101 formed by a rigid base deck 102 and a top cover 104 (shown in partial cutaway).

Mechanical components of the disc drive 100 are supported within the housing 101, including a spindle motor 106 which rotates a number of recording discs 108 at a constant high speed, and an actuator assembly 110 supports a corresponding number of data transducing heads 112 adjacent the discs 108. The actuator assembly is rotated about an actuator axis through application of current to a coil 114 of a voice coil motor (VCM) 116.

Figure 2:
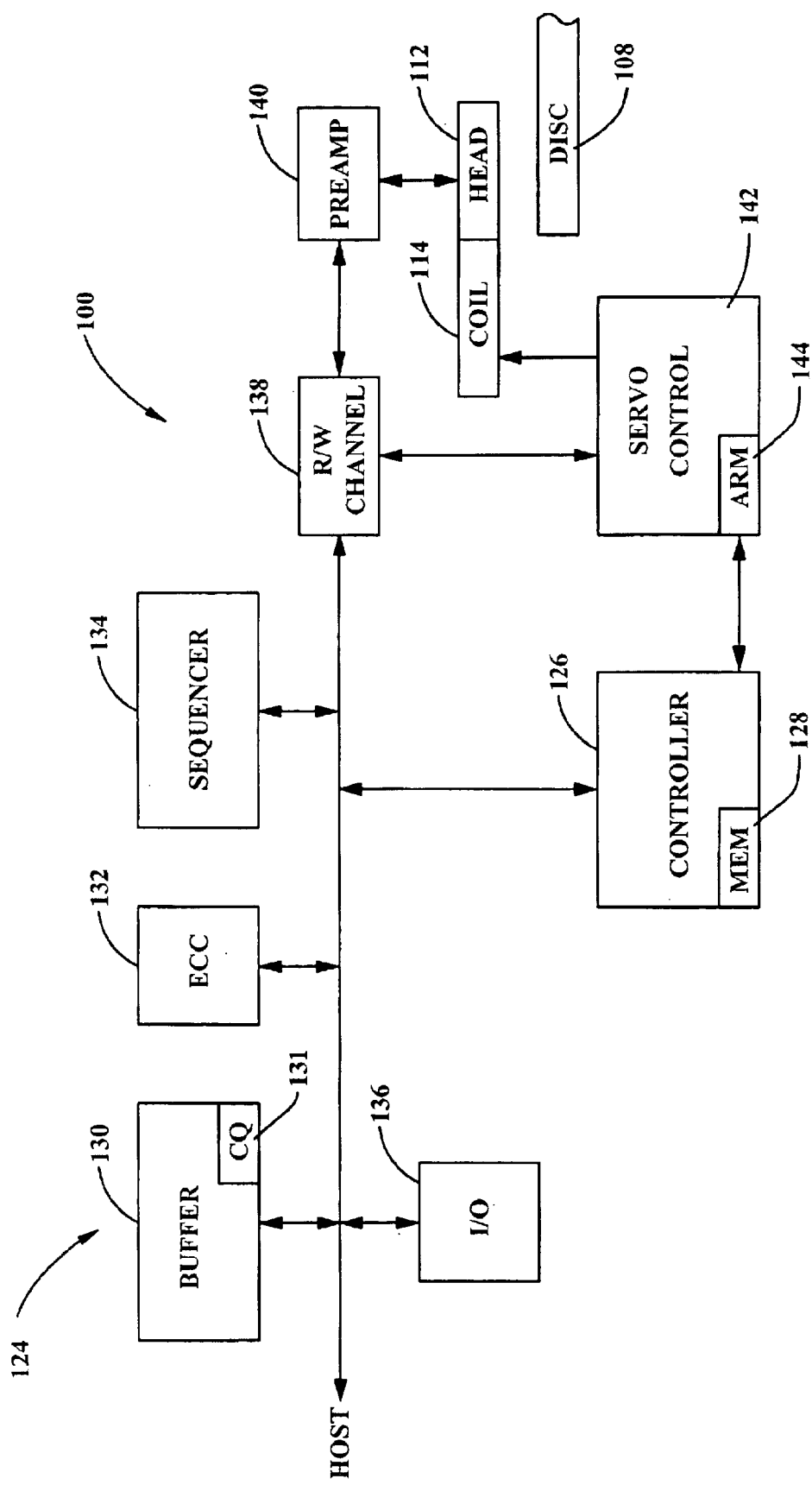
FIG. 2 illustrates a simplified functional block diagram of the disc drive shown in FIG. 1.

FIG. 2 provides a functional block diagram for the disc drive 100. A hardware/firmware based interface circuit 124 communicates with a host device (such as a personal computer, not shown) and directs overall disc drive operation. The interface circuit 124 includes a programmable controller (processor) 126 with associated memory 128, a buffer 130, an error correction code (ECC) block 132, a sequencer 134 and an input/output (I/O) control block 136.

The buffer 130 temporarily stores user data during read and write operations, and includes a command queue (CQ) 131 where multiple pending access operations are temporarily stored pending execution. The ECC block 132 applies on-the-fly error detection and correction to retrieved data. The sequencer 134 asserts read and write gates to direct the reading and writing of data. The I/O block 136 serves as an interface with the host device.

FIG. 2 further shows the disc drive 100 to include a read/write (R/W) channel 138 which encodes data during write operations and reconstructs user data from the discs 108 during read operations. A preamplifier/driver circuit (preamp) 140 applies write currents to the heads 112 and provides preamplification of readback signals.

A servo control circuit 142 uses servo data to provide the appropriate current to the coil 114 to position the heads 112 as required. The controller 126 communicates with the processor 144 to move the heads 112 to the desired locations on the discs 108 during execution of the various pending access commands in the command queue 131 in turn.

Figure 7:
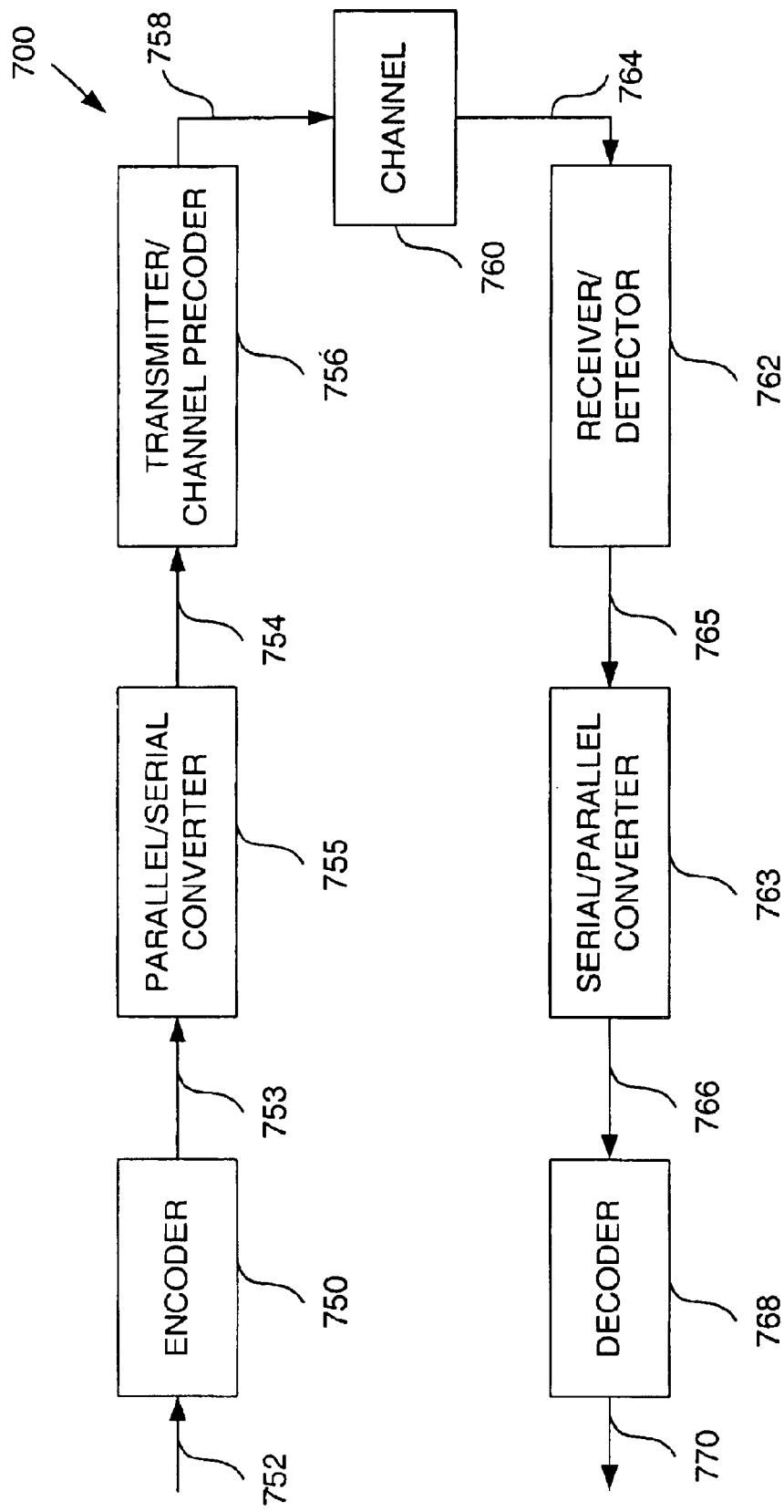
FIG. 7 is a block diagram of a generalized communication system in which an encoder can be used.

FIG. 7 is a block diagram of a generalized communication system 700 according to one embodiment of the present invention, which can be formed within disc drive 100, for example. Communication system 700 includes an encoder 750, which receives successive data words 752 and encodes the successive data words into successive code words 753. Each data word can include any number of symbols. In a binary system, for example, each symbol represents one logical data bit. As described in more detail below, successive data words are encoded into successive code words using a Run length Limited code with a "k" constraint. Encoder 750 is state driven, and all code words are carefully chosen such that the state can be determined using a small number of bits of each code word. Encoder 750 can be implemented with combinational logic or in software with a look-up table for making the conversion between each user data words and its corresponding code word. Other hardware and software implementations can also be used.

Parallel-to-serial converter 755 receives the successive code words 753, converts each code word into a serial representation and concatenates the serial representations to produce a serial stream of the code word bits 754. Precoder 756 receives the serial code word stream 754 and conditions the sequence so that it is optimized for the type of detector used to recover the signal from the channel. Precoder 756 produces an encoded signal 758, which is provided to channel 760.

In disc drive 100, channel 760 includes the write transducer in head 112, recording discs 108, and the read transducer in head 112. The encoded write signal is stored on the disc surface by the write transducer. During a read operation, the read transducer reads the stored, encoded information from the disc surface and conveys the encoded information to receiver/detector 762 as a read signal 764. Receiver/detector 762 amplifies and filters read signal 764, and then recovers the encoded information from the read signal using one of several known detection methods. After detecting and amplifying the signal from channel 760, receiver/detector 762 produces a recovered sequence of code word bits 765, which are provided to serial-to-parallel converter 763.

The sequence of code word bits 765 is in a serial format at the input to serial-to-parallel converter 763. Serial-to-parallel converter 763 groups the bits into code words and converts the code words from a serial format to a parallel format. Successively recovered code words 766 have lengths corresponding to the lengths of the code words generated by encoder 750. Serial-to-parallel converter 763 then outputs the successively recovered code words 766 in parallel format to decoder 768. Decoder 768 uses the inverse of the coding rules used by encoder 750 and converts successive code words 766 into respective data words 770.

Encoder 750 imposes several constraints on the bit patterns in code word stream 753. In a disc drive application, the rotational velocity of the disc can vary over time, thus, a phase locked loop (PLL) is used to lock the phase and frequency of the read timing clock to the phase and frequency of read signal 764. To ensure that the PLL is updated regularly, encoder 750 uses a code that limits the number of consecutive zeros in code word stream 753 to no greater than a maximum number "k". This kind of code is known as a Run Length Limited (RLL) code with a global "k" constraint.

In a RLL code of rate m/n, m-bit long data words are mapped into n-bit long code words that satisfy the selected RLL constraints, where m and n are positive integer variables. When m and n are large, the encoder becomes very complicated and error propagation in the decoder can be severe. The present invention solves this and other problems.

With respect to the following description, the following describes a class of run-length-limited (RLL) codes that can be straightforwardly constructed and also possess a high code rate efficiency. Although these methods can be applied to both odd and even values of "k", use of the even values gives relatively higher code efficiency. The description below is therefore focused on even values of "k".

In the design of a RLL code of "k" constrain, consider all binary patterns of "q" bits long, where "k" is an even integer and $q=k/2+1$. Thus, there are $2^q$ patterns, of which the all zero pattern is eliminated leaving $(2^q-1)$ patterns. The remaining $(2^q-1)$ patterns can be freely concatenated to form a RLL code of "k" constraint. This will be illustrated in a simple example of k=4, correspondingly q=k/2+1=3.

If there are a total of $(2^3-1)=7$ non-zero 3-bit patterns, they are "001", "010", "011", "100", "101", "110", and "111". When these patterns are put together, the longest possible run of zeroes is four (e.g. 100 001) which meets the requirement of "k". Next, consider how to form a m/n rate code using these 3-bit patterns.

To choose the values of "m" and "n", we realize that $2^m$ unconstrained patterns have to be mapped into "n" bits that meet the k=4 constraints. Therefore, $2^m$ must be smaller than the number of n-bit patterns that satisfy the "k" constraint. In using these 3-bit patterns, "n" must be three or multiples of three. (i.e. n=3g where g may be 1, 2, 3, . . . ) To ensure every m-bit pattern can be uniquely mapped into an n-bit pattern, $7^g$ must be greater than $2^m$. An obvious example is m=2 and g=1 because $7>2^2$, thus n=3.

Since there are 7 non-zero 3-bit patterns and only $2^2=4$ unconstrained input patterns, more than enough patterns are available for the 4 input patterns. For example, the input patterns "00", "01", "10", and "11" can be mapped into "001", "010", "101", and "110" respectively. If we define the inputs as $I_1, I_0$, and output bits as $O_2, O_1, O_0$, the encoder outputs can be expressed as $O_2=I_1$, $O_1=I_0$, and $O_0=-I_0$. While this mapping is simple, the code rate of 2/3=0.666 is low and far from the code capacity.

To increase the code rate, a greater value of "g" is needed such that the code rate m/n or m/(3g) will be as high as possible. However, the values of "g" and "m" should not be too large as that will increase the complexity of the encoder and decoder; thus, making the encoder and decoder too complicated to implement. Because the criteria of $7^g$ must be greater than $2^m$, different values of "m" that are less than 20 can be evaluated. The results of evaluating different values of "m" that are less than 20 confirm that the pairing of g=5 and m=14 satisfies the above condition and at the same time provides the largest code rate of m/n. In this situation, $7^5=16,807$ which is greater than $2^{14}=16,384$ and n=3g=15. Thus a 14/15-rate code of k=4 is possible.

Figure 3:
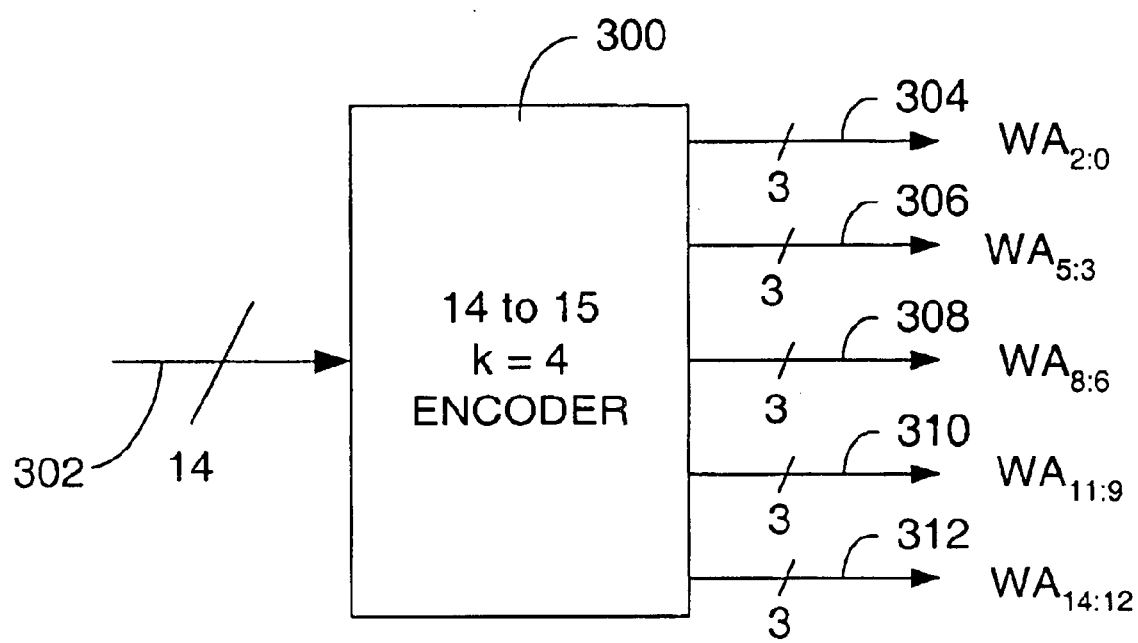
FIG. 3 is a block diagram of an embodiment of an encoder which can be used in the system shown in FIG. 7.

FIG. 3 shows a 14/15 encoder 300 implementing a k=4 constraint. One systematic way to map 14 bits of data 302 into a 15-bit code word is described as follows and summarized in Table 2.

One idea of 14-bit to 15-bit mapping is to map a 14-bit data pattern into five groups of 3-bit patterns 304, 306, 308, 310, 312 such that none of the 3-bit group will be "000". Assuming the 14 bits of data to be (D13, D12, D11, D10, D9, D8, D7, D6, D5, D4, D3, D2, D1, D0), and the 5 groups of output bits to be (C14, C13, C12), (C11, C10, C9), (C8, C7, C6), (C5, C4, C3), and (C2, C1, C0). By defining words U0=(D2, D1, D0), U1=(D5, D4, D3), U2=(D8, D7, D6), U3=(D11, D10, D9), and U4=(D13, D12), the mapping strategy is to map the data bits directly to the code bits if none of the four words U0, U1, U2 or U3 equals "000". That means bit C14 is mapped to 1 and the mapping of other bits are as shown in Table 1.

TABLE 1

| C14 | C13 | C12 | C11 | C10 | C9 | C8 | C7 | C6 | C5 | C4 | C3 | C2 | C1 | C0 |
|---|---|---|---|---|---|---|---|---|---|---|---|---|---|---|
| 1 | D13 | D12 | D11 | D10 | D9 | D8 | D7 | D6 | D5 | D4 | D3 | D2 | D1 | D0 |

If "000" does occur in one or more of the four data words, bit C14 will be mapped to 0 and the other output bits (Cn) will be encoded according to Table 2. The left column of Table 2 indicates the condition of each input word (Un), e.g. U0=0 means only (D2, D1, D0)=(0, 0, 0). According to Table 2, none of the five 3-bit code word will be output as "000". Notice that each row of table 2 is uniquely defined, therefore the decoder will be able to recover the data properly.

TABLE 2

| Condition | C14 | C13 | C12 | C11 | C10 | C9 | C8 | C7 | C6 | C5 | C4 | C3 | C2 | C1 | C0 |
|---|---|---|---|---|---|---|---|---|---|---|---|---|---|---|---|
| U3, U2, U1, U0 ≠ 0 | 1 | D13 | D12 | D11 | D10 | D9 | D8 | D7 | D6 | D5 | D4 | D3 | D2 | D1 | D0 |
| U0 = 0 | 0 | D13 | D12 | 1 | 1 | 1 | D11 | D10 | D9 | D8 | D7 | D6 | D5 | D4 | D3 |
| U1 = 0 | 0 | D13 | D12 | 1 | 1 | 0 | D11 | D10 | D9 | D8 | D7 | D6 | D2 | D1 | D0 |
| U2 = 0 | 0 | D13 | D12 | 1 | 0 | 1 | D11 | D10 | D9 | D5 | D4 | D3 | D2 | D1 | D0 |
| U3 = 0 | 0 | D13 | D12 | 1 | 0 | 0 | D8 | D7 | D6 | D5 | D4 | D3 | D2 | D1 | D0 |
| U1 = U0 = 0 | 0 | D13 | D12 | 0 | 1 | 1 | 1 | 1 | D11 | D10 | D9 | D8 | D7 | D6 |
| U2 = U0 = 0 | 0 | D13 | D12 | 0 | 1 | 1 | 1 | 0 | D11 | D10 | D9 | D5 | D4 | D3 |
| U3 = U0 = 0 | 0 | D13 | D12 | 0 | 1 | 1 | 1 | 0 | 1 | D8 | D7 | D6 | D5 | D4 | D3 |
| U2 = U1 = 0 | 0 | D13 | D12 | 0 | 1 | 1 | 0 | 0 | D11 | D10 | D9 | D2 | D1 | D0 |
| U3 = U1 = 0 | 0 | D13 | D12 | 0 | 1 | 0 | 1 | 1 | D8 | D7 | D6 | D2 | D1 | D0 |
| U3 = U2 = 0 | 0 | D13 | D12 | 0 | 1 | 0 | 1 | 0 | D5 | D4 | D3 | D2 | D1 | D0 |
| U2 = U1 = U0 = 0 | 0 | D13 | D12 | 0 | 1 | 0 | 0 | 1 | 1 | 0 | 0 | D11 | D10 | D9 |
| U3 = U1 = U0 = 0 | 0 | D13 | D12 | 0 | 1 | 0 | 0 | 1 | 1 | 0 | 1 | D8 | D7 | D6 |
| U3 = U2 = U0 = 0 | 0 | D13 | D12 | 0 | 1 | 0 | 0 | 1 | 1 | 1 | 0 | D5 | D4 | D3 |
| U3 = U2 = U1 = 0 | 0 | D13 | D12 | 0 | 1 | 0 | 0 | 1 | 1 | 1 | 1 | D2 | D1 | D0 |
| U3 = U2 = U1 = U0 = 0 | 0 | D13 | D12 | 0 | 1 | 1 | 0 | 0 | 1 | 0 | 1 | 1 | 1 | 1 | 1 |
| U4 = U0 = 0 | 0 | 1 | 1 | 0 | 1 | 0 | D11 | D10 | D9 | D8 | D7 | D6 | D5 | D4 | D3 |
| U4 = U1 = 0 | 0 | 1 | 1 | 0 | 0 | 1 | D11 | D10 | D9 | D8 | D7 | D6 | D2 | D1 | D0 |
| U4 = U2 = 0 | 0 | 1 | 0 | 0 | 1 | 0 | D11 | D10 | D9 | D5 | D4 | D3 | D2 | D1 | D0 |
| U4 = U3 = 0 | 0 | 1 | 0 | 0 | 0 | 1 | D8 | D7 | D6 | D5 | D4 | D3 | D2 | D1 | D0 |
| U4 = U1 = U0 = 0 | 0 | 0 | 1 | 0 | 1 | 0 | 1 | 1 | 1 | D11 | D10 | D9 | D8 | D7 | D6 |
| U4 = U2 = U0 = 0 | 0 | 0 | 1 | 0 | 1 | 0 | 1 | 1 | 0 | D11 | D10 | D9 | D5 | D4 | D3 |
| U4 = U3 = U0 = 0 | 0 | 0 | 1 | 0 | 1 | 0 | 1 | 0 | 1 | D8 | D7 | D6 | D5 | D4 | D3 |
| U4 = U2 = U1 = 0 | 0 | 0 | 1 | 0 | 1 | 0 | 1 | 0 | 0 | D11 | D10 | D9 | D2 | D1 | D0 |
| U4 = U3 = U1 = 0 | 0 | 0 | 1 | 0 | 1 | 0 | 0 | 1 | 1 | D8 | D7 | D6 | D2 | D1 | D0 |
| U4 = U3 = U2 = 0 | 0 | 0 | 1 | 0 | 1 | 0 | 0 | 1 | 0 | D5 | D4 | D3 | D2 | D1 | D0 |
| U4 = U2 = U1 = U0 = 0 | 0 | 0 | 1 | 0 | 1 | 0 | 0 | 0 | 1 | 1 | 0 | 0 | D11 | D10 | D9 |
| U4 = U3 = U1 = U0 = 0 | 0 | 0 | 1 | 0 | 1 | 0 | 0 | 0 | 1 | 1 | 0 | 1 | D8 | D7 | D6 |
| U4 = U3 = U2 = U0 = 0 | 0 | 0 | 1 | 0 | 1 | 0 | 0 | 0 | 1 | 1 | 1 | 0 | D5 | D4 | D3 |
| U4 = U3 = U2 = U1 = 0 | 0 | 0 | 1 | 0 | 1 | 0 | 0 | 0 | 1 | 1 | 1 | 1 | D2 | D1 | D0 |
| U4 = U3 = U2 = U1 = U0 = 0 | 0 | 0 | 1 | 0 | 1 | 0 | 1 | 1 | 0 | 0 | 1 | 1 | 1 | 1 | 1 |

This family of code may be extended to the next higher even value of "k", k=6 with q=6/2+1=4. If all of the $(2^4-1)=15$ non-zero 4-bit patterns are used as code words, the longest possible run of zeroes is six (1000 0001). In other words, these 4-bit patterns are able to form the RLL code of k=6. Thus, the 3-bit patterns from the 14/15 mapping can easily be extended to generate the 4-bit non-zero patterns.

The extension is based on the fact that for any positive integer r, $(2^r-1)*(2^r-1)$ is always greater than $(2^{r-1}-1)*(2^{r+1})$ by one, according to the following analysis:

$(2^r-1)*(2^r-1)=(2^{2r}-2^r-2^r+1)=(2^{2r}-2^{r+1}+1)$;

and $(2^{r-1}-1)*(2^{r+1})=(2^{2r}-2^{r+1})$;

therefore $(2^r-1)*(2^r-1)>(2^{r-1}-1)*(2^{r+1})$.

In the current context, r=4, and $(2^4-1)*(2^4-1)=15*15=225$, while $(2^{4-1}-1)*(2^{4+1})=(2^3-1)*(2^5)=7*32=224$. This analysis results in the conclusion that if a 3-bit non-zero pattern together with a 5-bit unconstrained pattern is provided, there are 224 resulting patterns. Thus, the 3-bit non-zero pattern together with the 5-bit unconstrained pattern can always be mapped into two 4-bit non-zero patterns since there are 225 possible patterns. This is not only true for r=4, but true for any positive integer r, thus this may be implemented in the design of RLL code of higher "k".

The mapping of 224 inputs can be done by a straightforward arrangement. Let $(A_2A_1A_0)$ be a 3-bit pattern not equal to (000) and $(B_4B_3B_2B_1B_0)$ is a 5-bit unconstrained pattern. These patterns can be mapped into two 4-bit words $(C_7C_6C_5C_4)$ and $(C_3C_2C_1C_0)$ such that they both do not equal (0000). The encoding or mapping rules can be considered in the following two cases:

Case 1: If $(B_3B_2B_1B_0) \neq (0000)$ then $(C_3C_2C_1C_0) = (B_3B_2B_1B_0)$ and $(C_7C_6C_5C_4)=(A_2A_1A_0B_4)$.

Since $(A_2A_1A_0)$ cannot be (000), $(C_7C_6C_5C_4)$ will never be encoded to (0000).

Case 2: If $(B_3B_2B_1B_0)=(0000)$ then $(C_3C_2C_1C_0)= (A_2A_1A_0B_4)$ and $(C_7C_6C_5C_4)=(0001)$.

As $(C_7C_6C_5C_4)$ is never mapped to (0001) in case 1, this mapping can be uniquely identified so the pattern can be recovered by the decoder.

Figure 4:
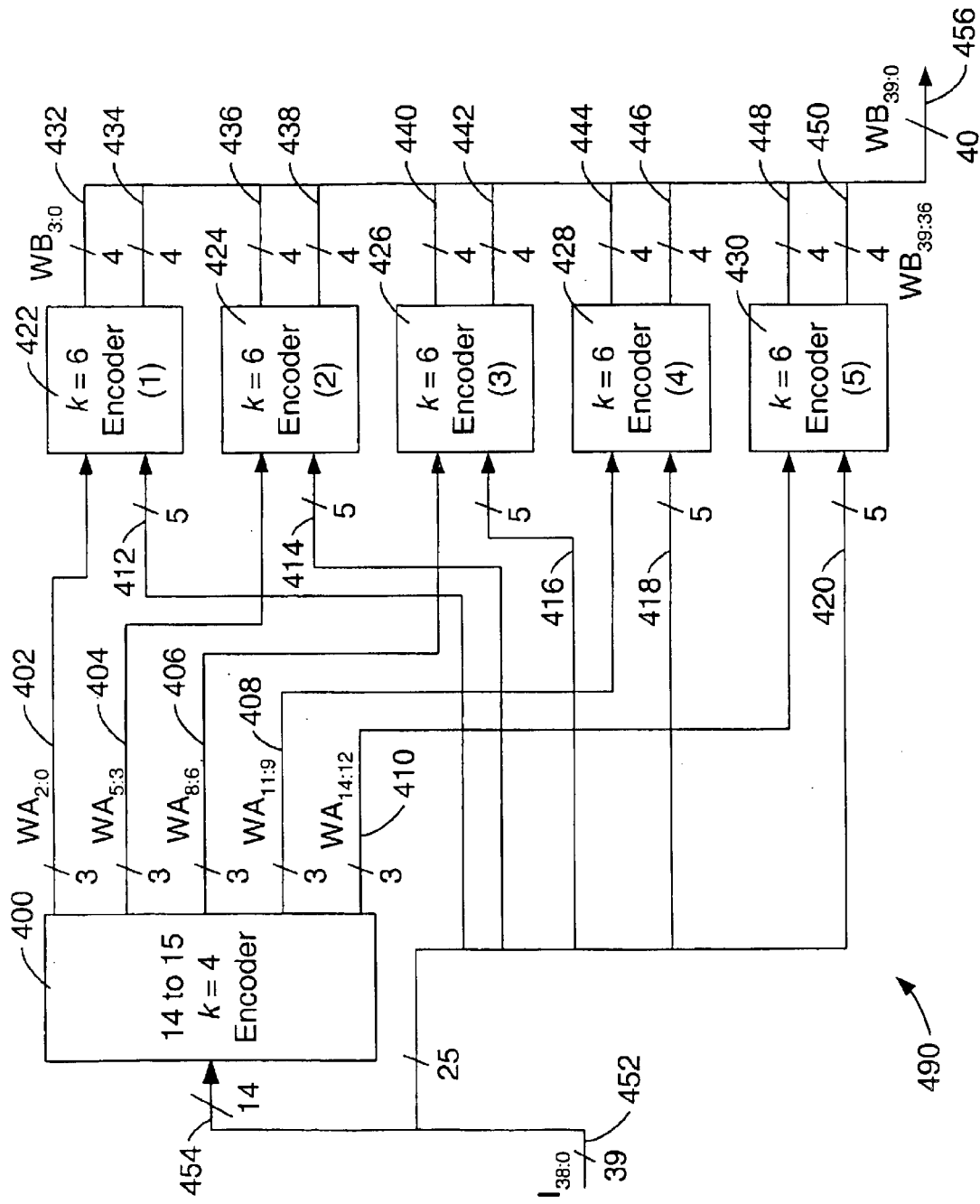
FIG. 4 is a block diagram of an embodiment of an encoder which can be used in the system shown in FIG. 7.

FIG. 4 illustrates how this encoding rule can be implemented in a k=6 encoder. Since there are five groups of 3-bit patterns 402, 404, 406, 408, 410 from the 14/15 encoder, each group of 3-bit is combined with a 5-bit unconstrained pattern 412, 414, 416, 418, 420 to form two 4-bit patterns 432 & 434, 436 & 438, 440 & 442, 444 & 446, 448 & 450 that satisfy the k=6 constraint. The five k=6 encoder blocks 422, 424, 426, 428, 430 are identical so only one is needed if the encoding or decoding speed is not critical. As seen in FIG. 4, a total of five groups of 5-bit patterns 412, 414, 416, 418, 420 together with the 14-bit pattern 454 make up the 39-bit input data word 452. They are mapped into ten 4-bit patterns 432, 434, 436, 438, 440, 442, 444, 446, 448, 450 that satisfy the k=6 constraint. This is how a rate 39/40 RLL code 456 is generated.

Figure 5:
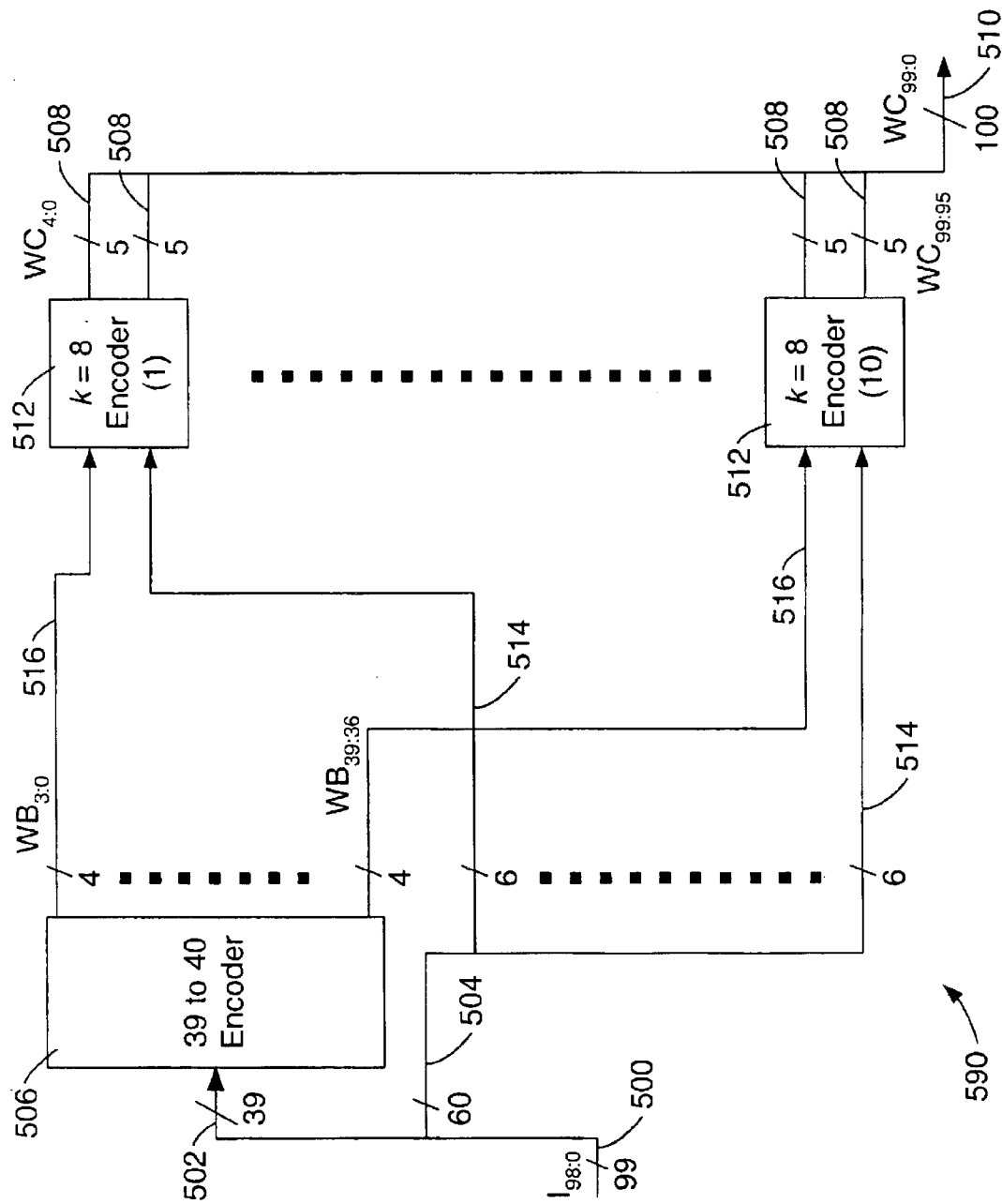
FIG. 5 is a block diagram of an embodiment of an encoder which can be used in the system shown in FIG. 7.

FIG. 5 illustrates how to achieve a k=8 RLL code using all 5-bit non-zero patterns 508. Thus, the longest possible run of zeroes is eight (10000 00001). Making use of the output of the 39/40 encoder 506, where ten 4-bit non-zero patterns 516 are available, it is possible to obtain the 5-bit non-zero patterns 508 easily. Similar to above, using a k=8 encoder 512, each 4-bit non-zero pattern 516 together with a 6-bit unconstrained pattern 514 can always be mapped into two 5-bit non-zero patterns 508. The encoding rule is similar to the k=6 code and can be expressed as shown in Table 3:

TABLE 3

| | C9 | C8 | C7 | C6 | C5 | C4 | C3 | C2 | C1 | C0 |
|---|---|---|---|---|---|---|---|---|---|---|
| B4, B3, B2, B1, B0 ≠ 0 | A3 | A2 | A1 | A0 | B5 | B4 | B3 | B2 | B1 | B0 |
| B4, B3, B2, B1, B0 = 0 | 0 | 0 | 0 | 0 | 1 | A3 | A2 | A1 | A0 | B5 |

In Table 3, $(C_9C_8C_7C_6C_5)$ and $(C_4C_3C_2C_1C_0)$ are the two 5-bit non-zero code patterns, $(A_3A_2A_1A_0)$ is a 4-bit pattern not equal to (0000) and $(B_5B_4B_3B_2B_1B_0)$ is a 6-bit unconstrained pattern. As seen in FIG. 5, a total of ten groups of 6-bit data patterns 504 together with the 39-bit input data pattern 502 of the 39/40 encoder make up the 99-bit input data word 500. The 6-bit data patterns 514 along with the 4-bit non-zero patterns 516 can be mapped into twenty 5-bit patterns 508 that satisfy the k=8 constraint. This is how a rate 99/100 k=8 RLL code 510 can be generated.

Figure 6:
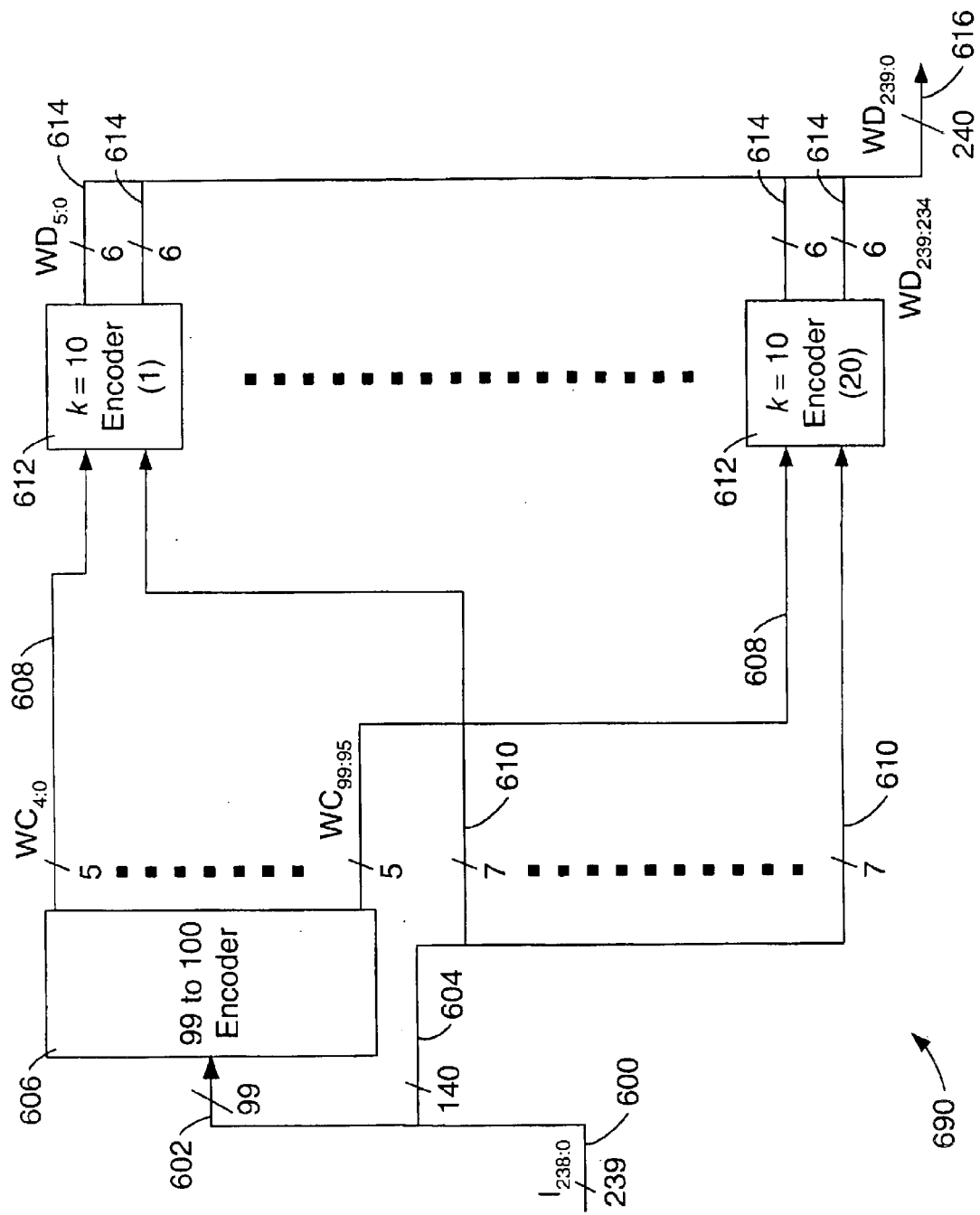
FIG. 6 is a block diagram of an embodiment of an encoder which can be used in the system shown in FIG. 7.

FIG. 6 shows how a 239/240 rate k=10 code 616 can be obtained from the rate 99/100 k=8 code. Here, twenty groups of 5-bit non-zero patterns 608 are used to help generate forty groups of 6-bit non-zero code patterns 614. The longest run of zeroes of these patterns is ten (100000 000001). Making use of the output of the 99/100 encoder 606, where twenty 5-bit non-zero patterns 608 are available, it is possible to obtain the 6-bit non-zero patterns 614 easily. Similar to above, using a k=10 encoder 612, each 5-bit non-zero pattern 608 together with a 7-bit unconstrained pattern 610 can always be mapped into two 6-bit non-zero patterns 614. The encoding rule is similar to the k=6 or k=8 codes and can be expressed as in Table 4.

TABLE 4

| | C11 | C10 | C9 | C8 | C7 | C6 | C5 | C4 | C3 | C2 | C1 | C0 |
|---|---|---|---|---|---|---|---|---|---|---|---|---|
| B5, B4, B3, B2, B1, B0 ≠ 0 | A4 | A3 | A2 | A1 | A0 | B6 | B5 | B4 | B3 | B2 | B1 | B0 |
| B5, B4, B3, B2, B1, B0 = 0 | 0 | 0 | 0 | 0 | 0 | 1 | A4 | A3 | A2 | A1 | A0 | B5 |

In Table 4, $(C_{11}C_{10}C_9C_8C_7C_6)$ and $(C_5C_4C_3C_2C_1C_0)$ are the two 6-bit non-zero code patterns, $(A_4A_3A_2A_1A_0)$ is a 5-bit pattern not equal to (00000) and $(B_6B_5B_4B_3B_2B_1B_0)$ is a 7-bit unconstrained pattern. As seen in FIG. 6, a total of twenty groups of 7-bit data patterns 604 together with the 99-bit input data pattern 602 of the 39/40 encoder make up the 239-bit input data word 600. The 7-bit data patterns 610 along with the 5-bit non-zero patterns 608 can be mapped into forty 6-bit patterns 614 that satisfy the k=10 constraint. This is how a rate 239/240 k=10 RLL code 616 can be generated.

By replicating this method, one may keep extending the "k" value and at the same time attain a higher rate code. The parameters for this family of RLL code can be generalized. Given the run length value "k", we may define j=k/2−2. A rate of m/n RLL code is achievable where $n=5*(j+3)*(2^j)$ and m=n−1. Table 5 summarizes these parameters for even values of "k" from 4 to 16.

TABLE 5

| k | j | n | m | m/n | Code Capacity | Code Efficiency |
|---|---|---|---|---|---|---|
| 4 | 0 | 15 | 14 | 0.93333 | 0.9752 | 0.95707 |
| 6 | 1 | 40 | 39 | 0.975 | 0.99419 | 0.9807 |
| 8 | 2 | 100 | 99 | 0.99 | 0.99858 | 0.99141 |
| 10 | 3 | 240 | 239 | 0.99583 | 0.99964 | 0.99619 |
| 12 | 4 | 560 | 559 | 0.99821 | 0.99991 | 0.9983 |
| 14 | 5 | 1280 | 1279 | 0.99922 | 0.99998 | 0.99924 |
| 16 | 6 | 2880 | 2879 | 0.99965 | 0.99999 | 0.99966 |

Table 5 shows the construction of very high rate RLL codes. From this, the results show that the code efficiency exceeds 99% when k=8 and the code rate is 0.99. when looking at higher values of "k", the code rate (m/n) and the code efficiency (code rate/code capacity) can be both over 99.9%. One remarkable feature of this family of high rate code is that the encoder and decoder can be simple and easily built. This is because the complexity of the code grows linearly with respect to "m" and "n" but not exponentially as in other designs of RLL code.

In summary, an embodiment of the present invention may be viewed as a method of encoding data words into code words which may be used to improve the performance of a digital communications system (such as a disc drive 100), the method preferably including encoding data words (such as 302, 454, 502, 602) into code words (such as 304, 402, 516, 608) according to a run-length-limited code of "k" constraint, the encoding producing u-bit non-zero code words, and increasing the "k" constraint to a higher value (such as 422, 512, 612) by extending the u-bit non-zero codewords (such as 402, 516, 608) to generate q-bit non-zero codewords (such as 432, 508, 614).

Another embodiment may involve mapping each u-bit non-zero code word (such as 402) with one (q+1)-bit unconstrained data word (such as 412) to obtain two q-bit non-zero codewords (such as 432 and 434).

Yet another embodiment may be viewed as a digital communications system having an encoder (such as 750) for encoding data words (such as 452) into code words (such as 432). The encoder including an m-bit data word (such as 452); a first encoder comprising a p-bit data word input (such as 454), a u-bit code word output (such as 402, 404, 406, 408, and 410), the p-bit data word input (such as 454) containing at least part of the m-bit data word (such as 452); a second encoder (such as 422) comprising a u-bit data word input (such as 402) and a (q+1) bit data word input (such as 412), a q-bit code word output (such as 432), the (u+q+1)-bit data word input containing at least part of the m-bit data word (such as 412) and at least part of the u-bit code word output (such as 402); a code implemented by the first encoder (such as 400) and the second encoder (such as 422) which achieves a high code rate as well as a high code efficiency by limiting a number of consecutive binary symbols appearing in a sequence of adjacent bit positions within the n-bit code word (such as 456). The digital communications system also comprising a channel and a decoder.

Further, another embodiment may be viewed as an encoding system (such as 490, 590, or 690) for encoding data words (such as 452) into code words (such as 456). The encoder including an m-bit data word (such as 452); a first encoder comprising a p-bit data word input (such as 454), a u-bit code word output (such as 402, 404, 406, 408, and 410), the p-bit data word input (such as 454) containing at least part of the m-bit data word (such as 452); a second encoder (such as 422) comprising a u-bit data word input (such as 402) and a (q+1)-bit data word input (such as 412), a q-bit code word output (such as 432), the (u+q+1)-bit data word input containing at least part of the m-bit data word (such as 412) and at least part of the u-bit code word output (such as 402); a code implemented by the first encoder (such as 400) and the second encoder (such as 422) which achieves a high code rate as well as a high code efficiency by limiting a number of consecutive binary symbols appearing in a sequence of adjacent bit positions within the n-bit code word (such as 456). The digital communications system also comprising a channel and a decoder.

In a preferred embodiment, m/n is 14/15, 39/40, 99/100, 239/240, 559/560, 1279/1280, or 2879/2880.

It is to be understood that even though numerous characteristics and advantages of various embodiments of the present invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application for the RLL code while maintaining substantially the same functionality without departing from the scope and spirit of the present invention. In addition, although the preferred embodiment described herein is directed to a disc drive implementing a digital communications channel, it will be appreciated by those skilled in the art that the teachings of the present invention can be applied to other systems, like CD-ROMs, DVDs, or cellular transmission systems, without departing from the scope of the present invention.

What is claimed is:

1. A method of encoding data words into code words, the method comprising steps of:
    (a) encoding data words according to a run-length-limited (RLL) code of "k" constraint, the encoding producing u-bit non-zero code words;
    (b) increasing the "k" constraint to a higher value by further encoding the u-bit non-zero code words to generate q-bit non-zero code words.

2. The method of claim 1, wherein the encoding step (a) further comprises:
    (a)(1) mapping a data word into first and second segments;
    (a)(2) encoding data words corresponding to a lower value of "k" to produce u-bit non-zero code words from the first segment; and
    (a)(3) providing (q+1)-bit unconstrained data words from the second segment.

3. The method of claim 2, wherein the increasing step (b) further comprises:
    (b)(1) mapping each u-bit non-zero code word with one (q+1)-bit unconstrained data word to obtain two q-bit non-zero code words.

4. The method of claim 1, wherein "k" further comprises an even integer.

5. The method of claim 1, wherein the higher value of "k" is equal to "k=2".

6. The method of claim 1, wherein "k" further comprises an odd integer.

7. The method of claim 1, further comprising:
    (c) implementing steps (a) and (b) in multiple levels to achieve a higher rate RLL code.

8. The method of claim 1, wherein the encoding step (a) further comprises encoding the data words according to a stored look-up table containing encoding rules.

9. The method of claim 3, wherein $j=k/2-2$ and a RLL code rate of m/n is achievable where $n=5*(j+3)*(2^j)$ and $m=n-1$.

10. A digital communications system comprising:
   an encoder for encoding data words into code words, the encoder comprising:
     an m-bit data word;
     a first encoder comprising a p-bit data word input, a u-bit code word output, the p-bit data word input containing at least part of the m-bit data word;
     a second encoder comprising a u-bit data word input and a (q+1)-bit data word input, a q-bit code word output, the (u+q+1)-bit data word input containing at least part of the m-bit data word and at least part of the u-bit code word output; and
     encoding rules implemented by the first and second encoders which achieve a high code rate as well as a high code efficiency by limiting a number of consecutive binary symbols appearing in a sequence of adjacent bit positions within the n-bit code word;
   a channel operatively coupled to the encoder for transmitting the code words; and
   a decoder operatively coupled to the channel that receives the code words and uses the inverse of the encoding rules used by the encoder to convert code words into data words.

11. The digital communications system of claim 10 wherein m/n is selected from the group consisting of: 14/15, 39/40, 99/100, 239/240, 559/560, 1279/1280, 2879/2880.

12. The digital communications system of claim 10 wherein the number of consecutive binary symbols is further limited to a maximum number (k) of consecutive binary zeroes appearing in a sequence of adjacent bit positions within the n-bit code word.

13. The digital communications system of claim 12 further comprising $j=k/2+2$, $n=5*(j+3)*(2^j)$, and $m=n-1$.

14. The digital communication system of claim 10 wherein the encoder comprises:
   at least one look-up table containing the encoding rules for the first and second encoders, comprising:
     a look-up table for the first encoder being organize to recognize the p-bit data word input and the u-bit code word output for the first encoder, and
     a look-up table for the second encoder being organized to recognize the (u+q+1)-bit data word input and the q-bit code word output for the second encoder.

15. An encoding system comprising:
   an m-bit data word;
   a first encoder comprising a p-bit data word input, a u-bit code word output, the p-bit data word input containing at least part of the m-bit data word;
   a second encoder comprising a u-bit data word input and a (q+1)-bit data word input, a q-bit code word output, the (u+q+1)-bit data word input containing at least part of the m-bit data word and at least part of the u-bit code word output; and
   encoding rules implemented by the first and second encoders which achieve a high code rate as well as a high code efficiency by limiting a number of consecutive binary symbols appearing in a sequence of adjacent bit positions within the n-bit code word.

16. The encoding system of claim 10 wherein m/n is selected from the group consisting of: 14/15, 39/40, 99/100, 239/240, 559/560, 1279/1280, 2879/2880.

17. The encoding system of claim 10 wherein the number of consecutive binary symbols is further limited to a maximum number (k) of consecutive binary zeroes appearing in a sequence of adjacent bit positions within the n-bit code word.

18. The encoding system of claim 12 further comprising $j=k/2+2$, $n=5*(j+3)*(2^j)$, and $m=n-1$.

19. The encoding system of claim 10 further comprising:
   at least one look-up table containing the encoding rules for the first and second encoders, comprising:
     a look-up table for the first encoder being organized to recognize the p-bit data word input and the u-bit code word output for the first encoder, and
     a look-up table for the second encoder being organized to recognize the (u+q+1)-bit data word input and the q-bit code word output for the second encoder.

* * * * *